US008451360B2

(12) United States Patent
Nakamura et al.

(10) Patent No.: US 8,451,360 B2
(45) Date of Patent: May 28, 2013

(54) SOLID-STATE IMAGING APPARATUS FOR SELECTIVELY OUTPUTTING SIGNALS FROM PIXELS THEREIN

(75) Inventors: Kohichi Nakamura, Kawasaki (JP); Hiroki Hiyama, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 381 days.

(21) Appl. No.: 12/767,007

(22) Filed: Apr. 26, 2010

(65) Prior Publication Data

US 2010/0295978 A1 Nov. 25, 2010

(30) Foreign Application Priority Data

May 19, 2009 (JP) ................................. 2009-121328

(51) Int. Cl.
*H04N 5/235* (2006.01)
*H04N 5/335* (2011.01)

(52) U.S. Cl.
USPC ......................... 348/308; 348/230.1; 348/272

(58) Field of Classification Search
USPC .............. 348/294–308, 230.1, 317, 320–324, 348/270–273
See application file for complete search history.

(56) References Cited

U.S. PATENT DOCUMENTS

| 6,670,990 | B1 | 12/2003 | Kochi et al. ................... 348/310 |
| 6,960,751 | B2 | 11/2005 | Hiyama et al. ............. 250/208.1 |
| 7,110,030 | B1 | 9/2006 | Kochi et al. ................... 348/308 |
| 7,429,764 | B2 | 9/2008 | Koizumi et al. .............. 257/292 |
| 7,557,847 | B2 | 7/2009 | Okita et al. ................... 348/308 |
| 7,638,826 | B2 | 12/2009 | Hiyama et al. ................. 257/291 |
| 2005/0237408 | A1 | 10/2005 | Muramatsu ................... 348/308 |
| 2005/0285958 | A1* | 12/2005 | Matsuda ....................... 348/300 |
| 2006/0044439 | A1 | 3/2006 | Hiyama et al. ............... 348/308 |
| 2008/0024630 | A1 | 1/2008 | Hiyama et al. ............... 348/241 |
| 2008/0055445 | A1 | 3/2008 | Hatano et al. ................. 348/302 |

(Continued)

FOREIGN PATENT DOCUMENTS

| CN | 1691759 A | 11/2005 |
| CN | 101212581 A | 7/2008 |

(Continued)

OTHER PUBLICATIONS

Chinese Office Action dated Dec. 8, 2011, in Counterpart Appln. No. 201010180879.4.

(Continued)

*Primary Examiner* — Sinh Tran
*Assistant Examiner* — Selam Gebriel
(74) *Attorney, Agent, or Firm* — Fitzpatrick, Cella, Harper & Scinto

(57) ABSTRACT

A solid-state imaging apparatus that shortens a time for reading out pixel signals of all pixels and improves the aperture ratio of pixels is provided. The solid-state imaging apparatus includes a plurality of pixels (3) arranged in a matrix along a plurality of rows and columns, in which each of the pixels includes a photoelectric conversion element and a color filter; a plurality of buffers (2) arranged with each one corresponding to a plurality of pixels; and a plurality of vertical output lines (1) arranged such that two or more of the vertical output lines (1) are arranged correspondingly to one of the columns of the pixels; in which an input node of each of the buffers is connected commonly to a plurality of pixels having color filters of different colors, and output nodes of the plurality of buffers are connected alternately to a plurality of vertical output lines.

7 Claims, 7 Drawing Sheets

U.S. PATENT DOCUMENTS

| | | | |
|---|---|---|---|
| 2008/0273093 A1 | 11/2008 | Okita et al. | 348/220.1 |
| 2009/0195683 A1* | 8/2009 | Honda et al. | 348/308 |
| 2009/0219429 A1 | 9/2009 | Ogura et al. | 348/308 |
| 2009/0303364 A1 | 12/2009 | Shibata et al. | 348/302 |
| 2010/0149394 A1 | 6/2010 | Yamazaki et al. | 348/308 |

FOREIGN PATENT DOCUMENTS

| | | |
|---|---|---|
| EP | 1 592 229 A2 | 11/2005 |
| EP | 1 940 148 A2 | 7/2008 |
| JP | 11-312800 A | 11/1999 |
| JP | 2005-311821 A | 11/2005 |
| JP | 2006-074367 A | 3/2006 |

OTHER PUBLICATIONS

Comm. from the Japanese Patent Office (JPO), dated Feb. 26, 2013, in counterpart Japanese Appl. No. 2009-121328, with partial translation.

* cited by examiner

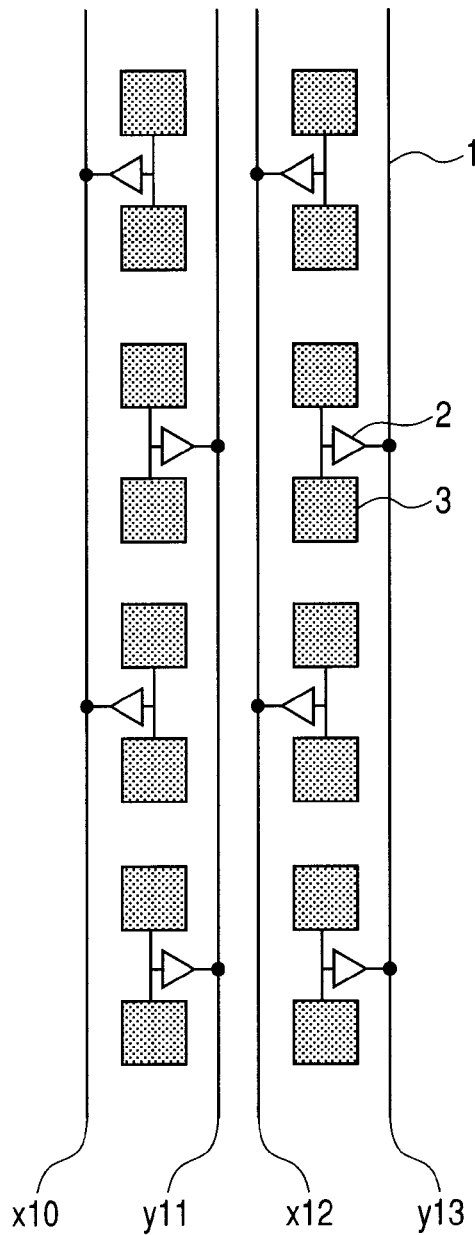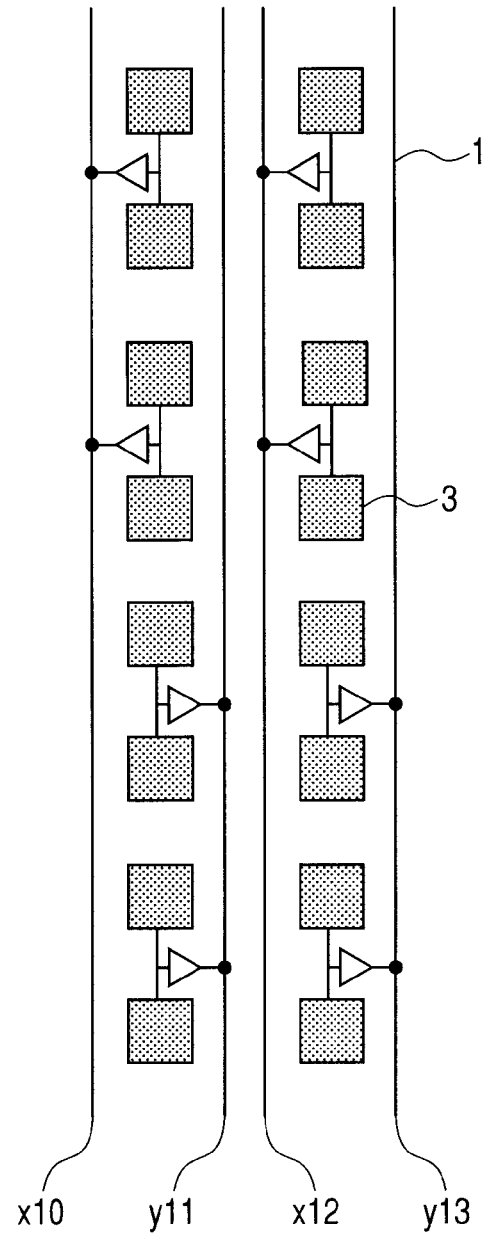

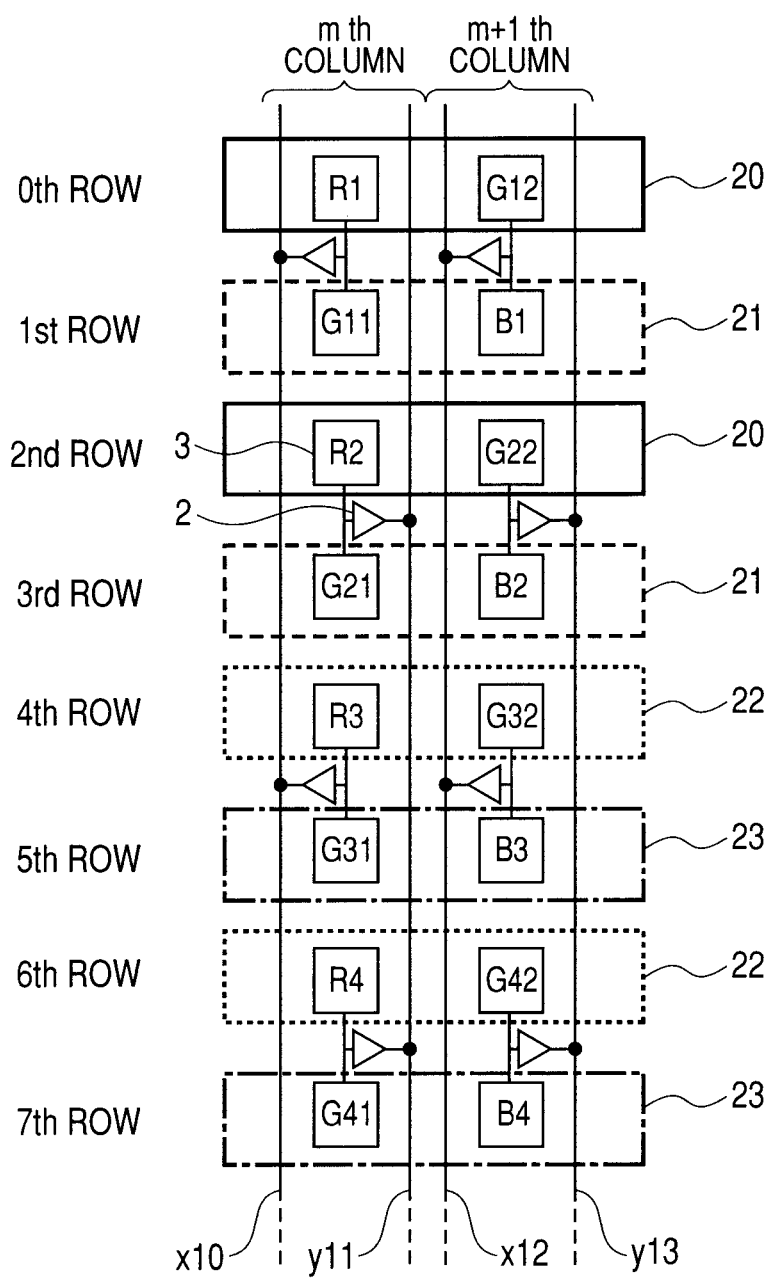

| READ OUT ROWS | 0th AND 2nd ROWS | 1st AND 3rd ROWS | 4th AND 6th ROWS | 5th AND 7th ROWS |
|---|---|---|---|---|
| VERTICAL OUTPUT LINE x10 IN mth COLUMN | R1 | G11 | R3 | G31 |
| VERTICAL OUTPUT LINE y11 IN mth COLUMN | R2 | G21 | R4 | G41 |
| VERTICAL OUTPUT LINE x12 IN m+1th COLUMN | G12 | B1 | G32 | B3 |
| VERTICAL OUTPUT LINE y13 IN m+1th COLUMN | G22 | B2 | G42 | B4 |

| READ OUT ROWS | 1st AND 2nd ROWS | 3rd AND 4th ROWS | 5th AND 6th ROWS |
|---|---|---|---|
| VERTICAL OUTPUT LINE x10 IN mth COLUMN | G11 | R3 | G31 |
| VERTICAL OUTPUT LINE y11 IN mth COLUMN | R2 | G21 | R4 |
| VERTICAL OUTPUT LINE x12 IN m+1th COLUMN | B1 | G32 | B3 |
| VERTICAL OUTPUT LINE y13 IN m+1th COLUMN | G22 | B2 | G42 |

READ OUT FROM ODD ROWS

READ OUT FROM EVEN ROWS

FIG. 9
| READ OUT ROWS | 1st AND 2nd ROWS | 3rd AND 4th ROWS | 5th AND 6th ROWS |
|---|---|---|---|
| mth COLUMN READ OUT CIRCUIT x60 | R2 | R3 | R4 |
| mth COLUMN READ OUT CIRCUIT y61 | G11 | G21 | G31 |
| m+1th COLUMN READ OUT CIRCUIT x62 | G22 | G32 | G42 |
| m+1th COLUMN READ OUT CIRCUIT y63 | B1 | B2 | B3 |
FIG. 10A
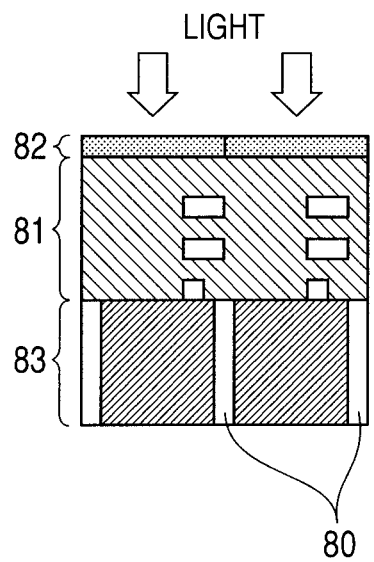
FIG. 10B
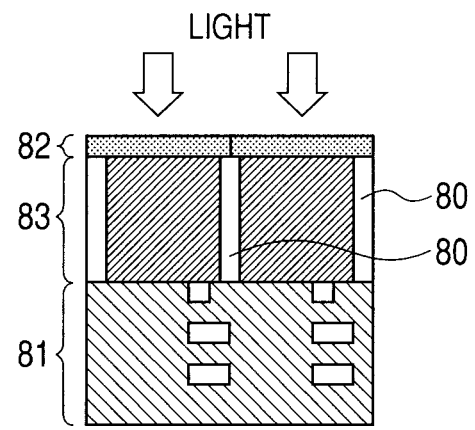

SOLID-STATE IMAGING APPARATUS FOR SELECTIVELY OUTPUTTING SIGNALS FROM PIXELS THEREIN

BACKGROUND OF THE INVENTION

1. Field of the Invention

The present invention relates to a solid-state imaging apparatus.

2. Description of the Related Art

Solid-state imaging apparatuses that are mounted in digital still cameras, video cameras, and cellular phones are being actively developed in recent years. CCD (Charge Coupled Devices) sensors and CMOS (Complementary Metal Oxide Semiconductor) sensors are widely known as solid-state imaging apparatuses. In particular, increasing levels of attention are being focused on CMOS sensors whose features include, in comparison to CCD sensors, lower power consumption, capability of high speed readouts, and system-on-a-chip integration.

A CMOS sensor includes an amplifier circuit that includes a floating diffusion amplifier or the like for each pixel. When reading out pixel signals, a method is widely used that selects a certain row from a pixel array portion in which a plurality of pixels are arranged in a matrix in a row direction and a column direction, and simultaneously reads out the pixel signals of all the pixels located in the selected row.

Demands for improving solid-state imaging apparatuses to achieve higher pixel densities and higher operation speeds are continuing to increase. For example, Japanese Patent Application Laid-Open No. 2005-311821 (hereafter, referred to as "Patent Document 1") discloses an apparatus that realizes a high speed readout by arranging a plurality of vertical output lines in each row and reading out a plurality of rows simultaneously.

However, according to the solid-state imaging apparatus described in Patent Document 1, although the apparatus is improved into a high operation speed by arranging a plurality of vertical output lines in each row and reading out pixel signals of a plurality of rows simultaneously, the area ratio of a photoelectric conversion element decreases because a buffer is provided for each pixel. That is, it is difficult to improve the solid-state imaging apparatus to achieve a high pixel density so that each pixel obtains a predetermined aperture ratio.

The present invention has been made in view of the above described problems, and an object of the invention is to provide a solid-state imaging apparatus that shortens a time for reading out pixel signals of all pixels, and improves the aperture ratio of pixels.

SUMMARY OF THE INVENTION

Further features of the present invention will become apparent from the following description of exemplary embodiments with reference to the attached drawings.

According to the present invention, a solid-state imaging apparatus comprises: a plurality of pixels arranged in a matrix along a plurality of rows and columns, wherein each of the pixels includes a photoelectric conversion element and a color filter; a plurality of buffers arranged commonly each one correspondingly to the plurality of pixels; and a plurality of vertical output lines arranged such that two or more of the vertical output lines are arranged correspondingly to one of the columns of the pixels, wherein an input node of each of the buffers is connected commonly to the pixels having color filters of different colors, and output nodes of the plurality of buffers are connected alternately to the plurality of vertical output lines.

Other features and advantages of the present invention will be apparent from the following description taken in conjunction with the accompanying drawings, in which like reference characters designate the same or similar parts throughout the figures thereof.

Preferred embodiments of the present invention will now be described in detail in accordance with the accompanying drawings.

BRIEF DESCRIPTION OF THE DRAWINGS

FIGS. 1A and 1B are schematic diagrams that illustrate a configuration example of a solid-state imaging apparatus according to a first embodiment of the present invention.

FIG. 2 is a view that illustrates a driving method of the solid-state imaging apparatus with the pixel configuration illustrated in FIGS. 1A and 1B.

FIG. 9 is a view that shows in time sequence the pixel signals that are input to column readout circuits.

FIGS. 10A and 10B are views that illustrate cross-sectional structures of pixels of a solid-state imaging apparatus.

Figures 3, 4:
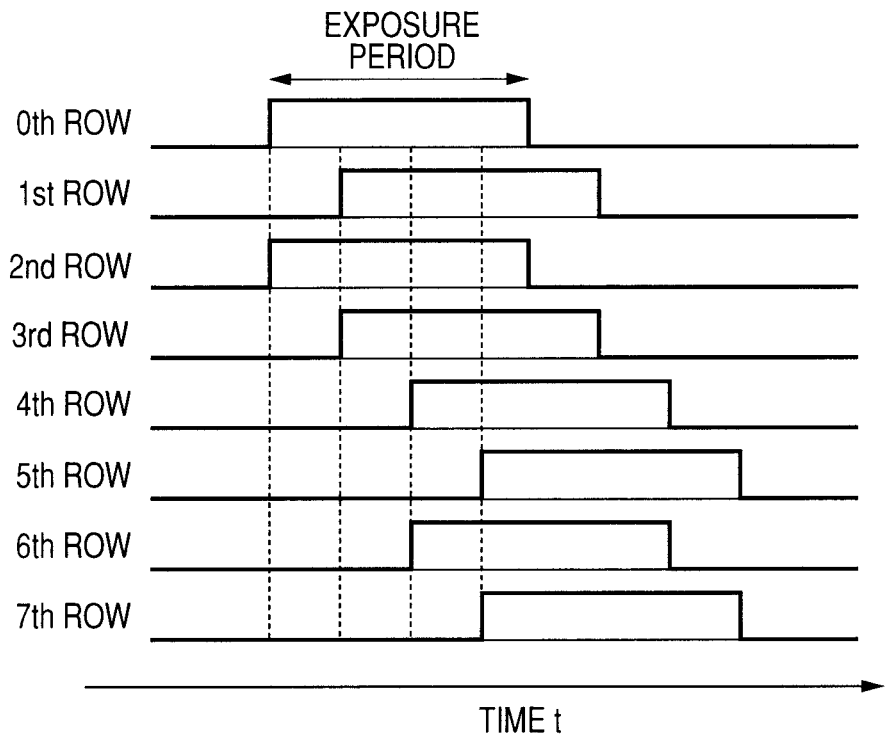
FIG. 3 is a view that shows in time sequence the pixel signals that are output from vertical output lines of each column.
FIG. 4 is a view that illustrates transitions in exposure periods of pixels of each row in FIG. 2.

The accompanying drawings, which are incorporated in and constitute a part of the specification, illustrate embodiments of the invention and, together with the description, serve to explain the principles of the invention.

DESCRIPTION OF THE EMBODIMENTS (First Embodiment)

FIG. 1A is a schematic diagram that illustrates a pixel layout structure of a solid-state imaging apparatus according to a first embodiment of the present invention. The figure illustrates an arbitrary adjacent two columns among a pixel array portion including a plurality of rows and a plurality of columns, and shows pixels of eight rows located in the two columns that are extracted from the two columns. According to the pixel layout structure in FIG. 1A, the solid-state imaging apparatus includes pixels 3, buffers 2 that are each commonly connected to two adjacent pixels in the row direction, and two vertical output lines for each column. Two vertical output lines 1 are alternately connected in the row direction to the buffers 2. The vertical output lines 1 include vertical output lines x10, y11, x12, and y13.

The solid-state imaging apparatus includes a pixel array portion in which pixels 3 that have a photoelectric conversion element 80, a color filter 82, and a plurality of transistors as shown in FIGS. 10A and 10B are arranged in a matrix along a plurality of rows and a plurality of columns. The solid-state imaging apparatus also includes buffers 2 that are arranged with each one corresponding to a plurality of pixels 3, and vertical output lines 1 arranged such that two or more thereof correspond to one of the columns. An input node of each buffer 2 is connected commonly to a plurality of pixels 3, and the vertical output lines 1 are connected alternately in the row direction to output nodes of the plurality of buffers 2.

According to the present embodiment, one output node by one output node, the plurality of buffers 2 are connected to the vertical output line 1. However, it would be apparent to those skilled in the art that, within a spirit and a scope of the present invention, the buffers 2 may be connected, through two or more output nodes continuously at one side, to the vertical output line 1, as shown in FIG. 1B.

FIG. 2 is a view illustrating a method of reading out pixel signals in a case in which a pixel arrangement with a layout as shown in FIG. 1A is applied to a solid-state imaging apparatus in which pixels are arranged according to the Bayer color array. FIG. 2 is a view that illustrates an arbitrary adjacent two columns among a pixel array portion, in which pixels located in the two columns are extracted from the 0th row to the 7th row. The adjacent two columns are taken as the m column and m+1 column. The two vertical output lines of each column are taken as a vertical output line x and a vertical output line y. In FIG. 2, a pixel with a red color filter is denoted by, for example, R1, a pixel with a green color filter is, for example, denoted by G11, and a pixel with a blue color filter is, for example, denoted by B1.

According to FIG. 2, first the signals of pixels located in the 0th row and 2nd row are read out. The pixel signals are output to vertical output lines through buffers that are different from each other. At this time, a pixel signal of the pixel R1 is output to the vertical output line x10 of the mth column, a pixel signal of a pixel R2 is output to the vertical output line y11 of the mth column, a pixel signal of a pixel G12 is output to the vertical output line x12 of the m+1th column, and a pixel signal of a pixel G22 is output to a vertical output line y13 of the m+1th column.

Next, signals of the pixels located in the 1st row and 3rd row are read out. At this time, a pixel signal of the pixel G11 is output to the vertical output line x10 of the mth column, a pixel signal of a pixel G21 is output to the vertical output line y11 of the mth column, a pixel signal of the pixel B1 is output to the vertical output line x12 of the m+1th column, and a pixel signal of a pixel B2 is output to the vertical output line y13 of the m+1th column.

Next, signals of the pixels located in the 4th row and 6th row are read out. At this time, a pixel signal of a pixel R3 is output to the vertical output line x10 of the mth column, a pixel signal of a pixel R4 is output to the vertical output line y11 of the mth column, a pixel signal of a pixel G32 is output to the vertical output line x12 of the m+1th column, and a pixel signal of a pixel G42 is output to the vertical output line y13 of the m+1th column.

Next, signals of the pixels located in the 5th row and 7th row are read out. At this time, a pixel signal of a pixel G31 is output to the vertical output line x10 of the mth column, a pixel signal of a pixel G41 is output to the vertical output line y11 of the mth column, a pixel signal of a pixel B3 is output to the vertical output line x12 of the m+1th column, and a pixel signal of a pixel B4 is output to the vertical output line y13 of the m+1th column.

FIG. 3 is a table that summarizes the output relationship of pixel signals with respect to read out rows. The table in FIG. 3 shows which pixel signals are output to each vertical output line with respect to read out rows. Thus, according to the present embodiment, pixel data of pixels positioned in alternate rows are read out to different vertical output lines simultaneously through different buffers 2, and the read out rows are sequentially shifted to perform read out as far as the last row in the pixel array portion.

FIG. 4 is a view that illustrates transitions in the exposure periods of pixels positioned in each row from the 0th row to the 7th row according to the present embodiment. A description regarding pixels of an 8th row and subsequent rows is omitted.

As described above, by providing two vertical output lines, the number of rows that are read out simultaneously b two rows, and thus the time required to read out data of all pixels is halved in comparison to a case in which one vertical output line is provided. Further, by making each buffer 2 common to two pixels in the row direction, in comparison to a case of providing a single buffer 2 for each pixel, it is possible to expect an improvement into a high aperture ratio and a high pixel density. Furthermore, as shown in FIG. 3, since signals output simultaneously to two vertical output lines x and y of each column are for pixels of the same color that are nearest in the row direction, addition between pixels adjacent in the vertical direction that have color filters of the same color is simple.

A row selection line that selects a read out row of pixels, and a column readout circuit connected to vertical output lines x and y of each column are omitted from the illustration in FIG. 2. According to the embodiment shown in FIG. 2, each one of buffers 2 is connected to each pair of pixels (e.g. R11 and G11; R2 and G21; G12 and B1 and G22 and B2). However, the present invention is not limited to this configuration of connection. It would be apparent to those skilled in the art within a spirit and scope of the present invention that each one of buffers 2 may be connected to every three or more of the pixels, so long as the plurality of pixels connected to common one buffer 2 include at least one pixel of which color is different from that of the other pixels. For example, uppermost left side buffer 2 may be connected pixels R11, G11 and R2. And, uppermost right side buffer 2 may be connected to pixels G12, B1 and G22.

(Second Embodiment)

Figure 5:
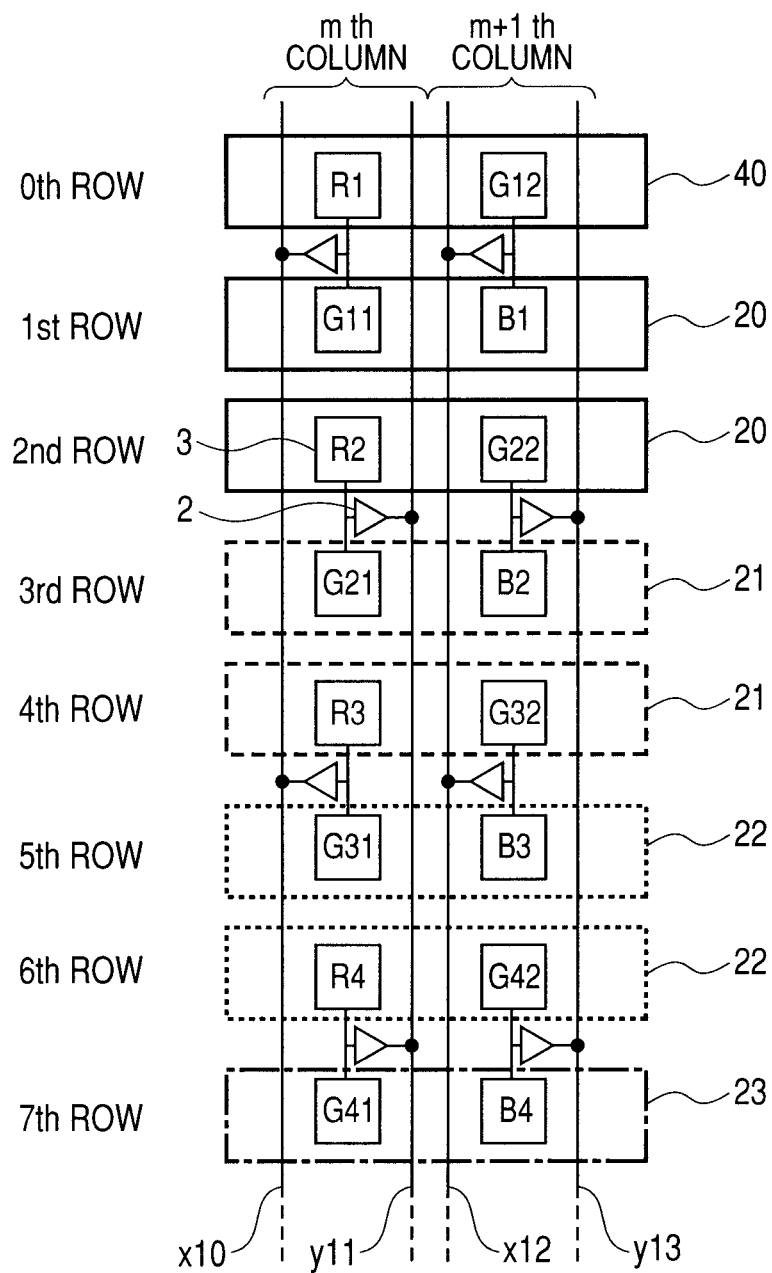
FIG. 5 is a view that illustrates a driving method of a solid-state imaging apparatus according to a second embodiment of the present invention.

FIG. 5 is a view illustrating a read out method of a solid-state imaging apparatus according to a second embodiment of the present invention, and illustrates a different read out method of a solid-state imaging apparatus in which pixels are arranged according to the Bayer color array similarly to the first embodiment. According to the present embodiment, read out of the 0th row of the pixel array portion is not performed. Instead, first the signals of pixels located in the 1st row and 2nd row are read out. The signals of pixels located in the 1st row and 2nd row are output to vertical output lines through buffers 2 that are different to each other. At this time, the pixel signal of the pixel G11 is output to the vertical output line x10 of the mth column, the pixel signal of the pixel R2 is output to the vertical output line y11 of the mth column, the pixel signal of the pixel B1 is output to the vertical output line x12 of the m+1th column, and the pixel signal of the pixel G22 is output to the vertical output line y13 of the m+1th column.

Next, signals of pixels located in the 3rd row and 4th row are read out. At this time, the pixel signal of the pixel R3 is output to the vertical output line x10 of the mth column, the pixel signal of the pixel G21 is output to the vertical output line y11 of the mth column, the pixel signal of the pixel G32 is output to the vertical output line x12 of the m+1th column, and the pixel signal of the pixel B2 is output to the vertical output line y13 of the m+1th column.

Next, signals of pixels located in the 5th row and 6th row are read out. At this time, the pixel signal of the pixel G31 is output to the vertical output line x10 of the mth column, the pixel signal of the pixel R4 is output to the vertical output line y11 of the mth column, the pixel signal of the pixel B3 is output to the vertical output line x12 of the m+1th column, and the pixel signal of the pixel G42 is output to the vertical output line y13 of the m+1th column.

Figures 6, 7:
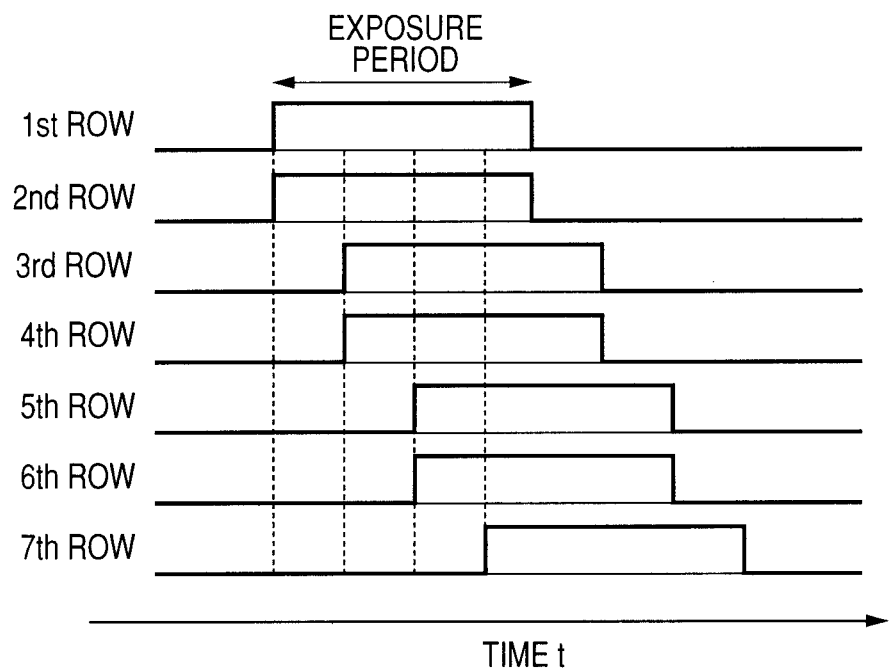
FIG. 6 is a view that shows in time sequence the pixel signals that are output from vertical output lines of each column.
FIG. 7 is a view that illustrates transitions in exposure periods of pixels of each row in FIG. 6 and FIGS. 8A and 8B.

FIG. 6 is a table that summarizes the output relationship of pixel signals with respect to read out rows, and shows which pixel signals are output to each vertical output line with respect to read out rows. A description regarding output of signals of pixels located in the 7th row and subsequent rows is omitted.

Thus, according to the present embodiment, a first pair of pixel signals of pixels located in two rows that are adjacent in the row direction and for which the buffers 2 are different to each other are read out simultaneously to different vertical output lines through the different buffers 2. A second pair of pixel signals of pixels located in two rows for which the buffer 2 is common are read out at different timings to the same vertical output line through the same buffer 2. The two rows as read out rows are sequentially shifted so as to read out the pixel signals of all pixels. The exposure periods of pixels located in each row for selecting two rows that are adjacent in the row direction are as shown in FIG. 7.

By using the present embodiment, in addition to shortening read out periods and improving into high pixel density, exposure periods can be changed in row order as shown in FIG. 7. It is also possible to simultaneously read out four pixels included in a Bayer color array. Hence, control and image processing of an imaging apparatus are simplified. Although according to the present embodiment a read out method has been described that does not read signals of pixels located in the 0th row, the present invention is not limited thereto. An arrangement may also be adopted that reads out only the signals of pixels located in the 0th row first.

A row selection line that selects a read out row of pixels, and a column readout circuit connected to vertical output lines x and y of each column are omitted from the illustration in FIG. 5.

(Third Embodiment)

Figure 8A:
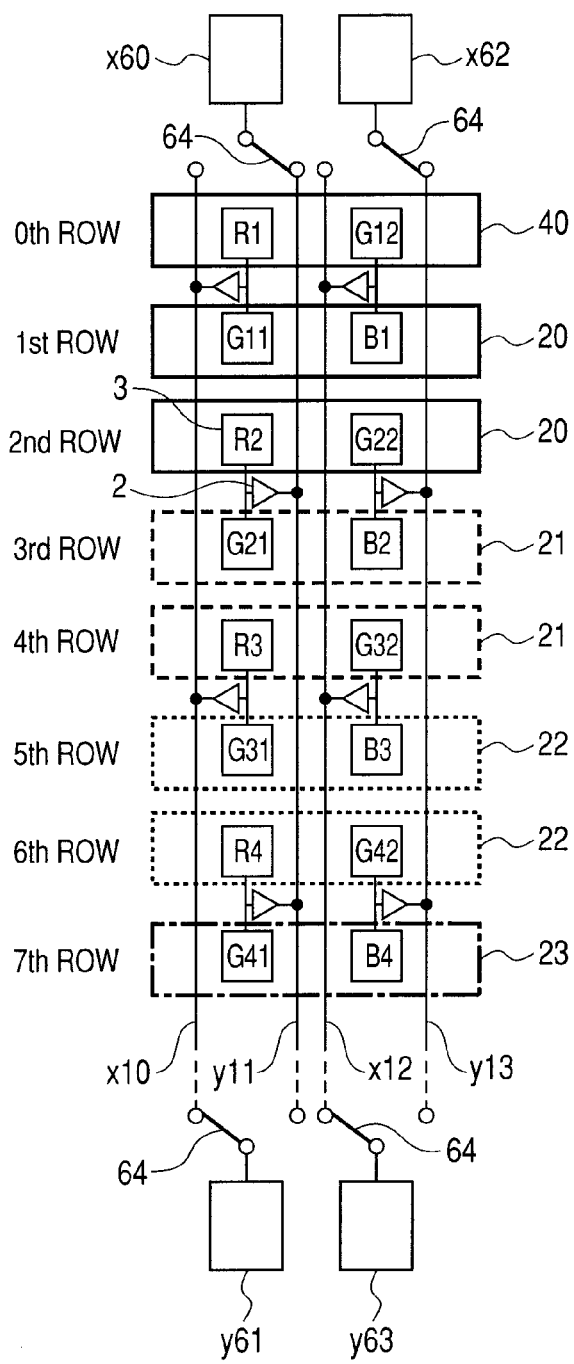
FIGS. 8A and 8B are views that illustrate a read out method of a solid-state imaging apparatus according to a third embodiment of the present invention.
Figure 8B:
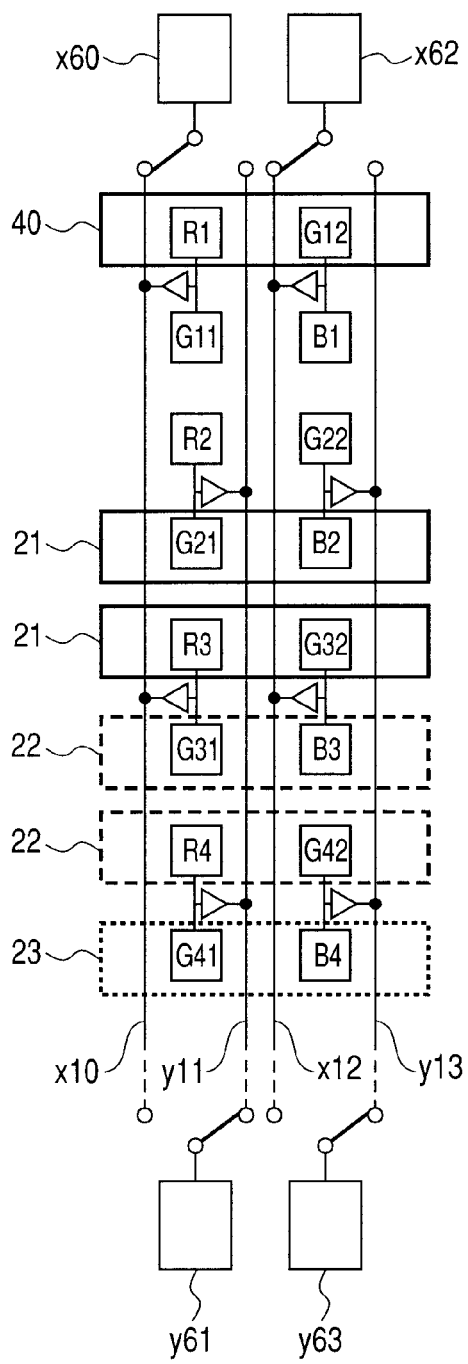

FIGS. 8A and 8B are views that illustrate a read out method of a solid-state imaging apparatus according to a third embodiment of the present invention. FIGS. 8A and B are views that illustrate configuration examples of change-over switches for each column. FIG. 8A is a view that illustrates connections between column readout circuits and vertical output lines when reading out from odd rows. FIG. 8B is a view that illustrates connections between column readout circuits and vertical output lines when reading out from even rows. A description of components and operations that are the same as in FIG. 5 is omitted below.

In FIGS. 8A and 8B, the column readout circuits of each column are denoted as column readout circuit x and y. Switching elements 64 are disposed between column readout circuits x60, y61, x62, and y63 of the mth column and m+1th column and the vertical output lines x10, y11, x12, and y13 of the mth column and m+1th column. For example, the column readout circuit x60 is selectively connected to either the vertical output line x10 or the vertical output line y11 of the mth column.

A read out operation is performed as follows. First, signals of pixels located in the 1st row and 2nd row are read out. At this time, the column readout circuit x60 of the mth column is connected via the switching element 64 to the vertical output line y11 of the mth column, and the column readout circuit y61 of the mth column is connected via the switching element 64 to the vertical output line x10 of the mth column. The column readout circuit x62 of the m+1th column is selected via the switching element 64 to the vertical output line y13 of the m+1th column. The column readout circuit y63 of the m+1th column is connected via the switching element 64 to the vertical output line x12 of the m+1th column. The connection relationship between the column readout circuits x60, y61, x62, and y63 and the vertical output lines x10, y11, x12, and y13 of each column is as shown in FIG. 8A.

Next, the signals of pixels located in the 3rd row and 4th row are read out. At this time, the column readout circuit x60 of the mth column is connected to the vertical output line x10 via the switching element 64, and the column readout circuit y61 of the mth column is connected to the vertical output line y11 of the mth column via the switching element 64. The column readout circuit x62 of the m+1th column is connected to the vertical output line x12 via the switching element 64, and the column readout circuit y63 of the m+1th column is connected to the vertical output line y13 via the switching element 64. The connection relationship between the column readout circuits x60, y61, x62, and y63 and the vertical output lines x10, y11, x12, and y13 of each column is as shown in FIG. 8B.

Next, the signals of pixels located in the 5th row and 6th row are read out. At this time, the column readout circuit x60 of the mth column is connected to the vertical output line y11 via the switching element 64, and the column readout circuit y61 of the mth column is connected to the vertical output line x10 of the mth column via the switching element 64. The column readout circuit x62 of the m+1th column is connected to the vertical output line y13 via the switching element 64, and the column readout circuit y63 of the m+1th column is connected to the vertical output line x12 via the switching element 64. The connection relationship between the column readout circuits x60, y61, x62, and y63 and the vertical output lines x10, y11, x12, and y13 of each column is as shown in FIG. 8A.

As described above, the method of reading out pixel signals of the present embodiment selects two rows that are adjacent in the row direction and for which buffers 2 that are common to two pixels are different, and reads out the signals of pixels located in the selected TOWS. Further, a connection between vertical output lines x10, y11, x12 and y13 and column readout circuits x60, y61, x62, and y63 of each column is switched between a time of reading out even rows and reading out odd rows by the switching element 64. More specifically, the connection relationship between vertical output lines and column readout circuits of each column is one whereby the connection relationship of FIG. 8A and the connection relationship of FIG. 8B are alternately repeated each time a row for reading out pixel signals is changed. Since the signals of pixels located in two rows that are adjacent in the row direction are simultaneously read out, the exposure periods of pixels located in each row are the same as in the second embodiment as illustrated in FIG. 7.

FIG. 9 is a table that summarizes the output relationship of pixel signals with respect to read out rows, which illustrates which pixel signals are input to each column readout circuit with respect to read out rows. The relationship with respect to output of signals of pixels located in the 7th row and subsequent rows is omitted from the table.

By applying the present embodiment, shortening of a readout period of signals of all pixels is realized, and the arrangement is easily adapted to improving into high pixel density. Further, it is possible to simultaneously read out signals of four pixels included in a Bayer color array, and exposure periods for each row can be changed in row order. As shown in FIG. 9, since signals of pixels that have the same color filters are input into respective column readout circuits, addition between pixels adjacent in the vertical direction that have pixel signals for the same color is simple.

Although in the example shown in FIGS. 8A and 8B, an arrangement is adopted in which the column readout circuits x60, y61, x62, and y63 and the switching elements 64 are provided separately from the pixel region at the top and bottom, the present invention is not limited thereto. For example, an arrangement may be adopted in which the column readout circuits x60, y61, x62, and y63 and the switching elements 64 are disposed only on the bottom side. In this connection, a row selection line that selects read out rows of pixels is omitted from the illustration in FIGS. 8A and 8B.

Although in each of the above described embodiments, vertical output lines are disposed on both sides of the relevant column, the present invention is not limited thereto. An arrangement may also be adopted in which the relevant plurality of vertical output lines is disposed on one side of the column. For example, an arrangement may be adopted in which both the vertical output line x10 and the vertical output line y11 of the mth column are disposed on the left side of the pixels.

Although according to each of the above described embodiments a read out method is employed that sequentially shifts a read out row from an initial row of a pixel array portion to a final row of the pixel array portion, the present invention is not limited thereto. For example, a method may be employed that selects and reads out only the required rows.

Although a pixel layout structure in which two vertical output lines are arranged for each column, respectively, is described in each of the above embodiments, the present invention is not limited thereto. For example, three vertical output lines may be provided for each column, or four or more vertical output lines may be provided for each column. It is desirable that the number of column readout circuits for each column be equivalent to the number of vertical output lines.

Although an arrangement in which a single common buffer is provided for two pixels is adopted according to each of the above described embodiments, the present invention is not limited thereto. For example, a single common buffer may be provided for four pixels, or a buffer may be shared by a number of pixels greater than four.

Although an arrangement in which common buffers are disposed at the same positions in the row direction irrespective of columns is adopted according to each of the above embodiments, the present invention is not limited thereto. For example, the positions of common buffers in the row direction may be changed for each column.

Although an arrangement in which the pixels connected to a common buffer are pixels that are adjacent in the row direction is adopted according to each of the above embodiments, the present invention is not limited thereto. For example, an arrangement may be adopted in which a buffer is shared by a total of four pixels including two pixels adjacent in the row direction and two pixels adjacent in the column direction.

FIG. 10A is a view that illustrates the cross-sectional structure of a pixel of a front surface irradiation type solid-state imaging apparatus. FIG. 10B is a view that illustrates the cross-sectional structure of a pixel of a rear surface irradiation type solid-state imaging apparatus. The pixels of the solid-state imaging apparatuses illustrated in FIGS. 10A and 10B include a photoelectric conversion element 80 formed in a substrate 83, and a circuit and wiring layer 81 formed on the surface of the substrate 83. According to the front surface irradiation type solid-state imaging apparatus shown in FIG. 10A, a color filter 82 is formed on the upper surface of the circuit and wiring layer 81 on the substrate surface side, and receives light from the substrate surface side. According to the rear surface irradiation type solid-state imaging apparatus shown in FIG. 10B, the color filter 82 is formed on the rear surface of the substrate 83, and receives light from the rear surface side of the substrate.

By applying the first to third embodiments to the front surface irradiation type solid-state imaging apparatus shown in FIG. 10A and the rear surface irradiation type solid-state imaging apparatus shown in FIG. 10B, the area of the pixel circuit can be reduced because a buffer to be connected to a pixel can be shared by a plurality of pixels. Hence, the first to third embodiments can be applied to both a front surface irradiation type solid-state imaging apparatus and a rear surface irradiation type solid-state imaging apparatus.

According to the solid-state imaging apparatus of the first to third embodiments, a time for reading out pixel signals of all pixels can be shortened, and the aperture ratio of pixels can be improved.

It is to be understood that each of the above described embodiments are intended to merely illustrate specific examples for implementing the present invention, and are not intended to limit the technical scope of the present invention. More specifically, the present invention can be implemented in various forms without departing from the technical concept or the principal features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-121328, filed May 19, 2009, which is hereby incorporated by reference herein in its entirety.

What is claimed is:

1. A solid-state imaging apparatus comprising:
a plurality of pixels arranged in a matrix in a plurality of rows and columns, wherein each of the plurality of pixels includes a photoelectric conversion element and a color filter;
a plurality of buffers, that includes buffers which are each shared by a pair of pixels, of the plurality of pixels, respectively having color filters of first and second colors different from each other and being disposed in a same column; and
a plurality of vertical output lines arranged such that a pair of the vertical output lines are arranged correspondingly to one of the columns of the pixels,
wherein (i) signals are outputted from the pixels having the color filters of the first color from among the pairs of pixels in the same column through the buffers simultaneously to the pair of the vertical output lines, and thereafter (ii) signals are outputted from the pixels having the color filters of the second color from among the pairs of pixels in the same column through the buffers simultaneously to the pair of the vertical output lines.

2. The solid-state imaging apparatus according to claim 1, wherein a first horizontal couple of the plurality of pixels which are adjacent in a row direction output signals simultaneously through different buffers to different vertical output lines, and
a second horizontal couple of the plurality of pixels which are adjacent in the row direction output signals at different timings through the different buffers to the different vertical output lines.

3. The solid-state imaging apparatus according to claim 1, further comprising;
- a plurality of column read out circuits arranged such that two or more of the column read out circuits correspond to each of the plurality of columns; and
- a plurality of switching circuits each configured to selectively connect one of the plurality of column read out circuits and the plurality of vertical output lines.

4. The solid-state imaging apparatus according to claim 1, wherein pixels in odd rows output signals simultaneously through different buffers to different vertical output lines, or pixels in even rows output signals simultaneously through different buffers to different vertical output lines.

5. The solid-state imaging apparatus according to claim 1, wherein the color filters of different colors are arranged in Bayer color array.

6. The solid-state imaging apparatus according to claim 3, wherein the color filters of different colors are arranged in Bayer color array, and each of the plurality of column read out circuits inputs signals from the pixels having the color filters of the same colors.

7. The solid-state imaging apparatus according to claim 1, further comprising:
- a plurality of second buffers, each one of the second buffers being shared by a pair of pixels having color filters of the first color and a third color in another column of pixels, and the third color being different from the first and second colors,
- wherein (i) signals are outputted from the pixels having the color filters of the first color from among the pairs of pixels in the another column through the second buffers simultaneously to a second pair of the vertical output lines, and thereafter (ii) signals are outputted from pixels having the color filters of the third color from among the pairs of pixels in the another column through the second buffers simultaneously to the second pair of the vertical output lines.

* * * * *